United States Patent [19]

Kuroda et al.

[11] Patent Number: 4,835,581

[45] Date of Patent: May 30, 1989

[54] ELECTRON GAS HOLE GAS TUNNELING TRANSISTOR DEVICE

[75] Inventors: Takao Kuroda; Akiyoshi Watanabe, both of Koganei; Takao Miyazaki, Hachioji; Hiroyoshi Matsumura, Saitama, all of Japan

[73] Assignee: Hitachi, Ltd., Tokyo, Japan

[21] Appl. No.: 76,765

[22] Filed: Jul. 23, 1987

[30] Foreign Application Priority Data

Jul. 25, 1986 [JP] Japan .................... 61-173649

[51] Int. Cl.⁴ .................................. H01L 29/161
[52] U.S. Cl. ............................ 357/16; 357/15; 357/22; 357/56
[58] Field of Search ............... 357/16, 22, 15, 56

[56] References Cited

U.S. PATENT DOCUMENTS

| 4,538,165 | 8/1985 | Chang et al. ............. | 357/16 |
| 4,686,550 | 8/1987 | Capasso et al. ........... | 357/89 |
| 4,748,484 | 5/1988 | Takakuwa et al. ......... | 357/16 |

FOREIGN PATENT DOCUMENTS

| 196517 | 10/1986 | European Pat. Off. ...... | 357/22 MD |
| 2913068 | 10/1980 | Fed. Rep. of Germany ........ | 357/22 MD |
| 59-111371 | 6/1984 | Japan .......................... | 357/22 MD |
| 60-263471 | 12/1985 | Japan .......................... | 357/22 MD |
| 60-263472 | 12/1985 | Japan .......................... | 357/22 MD |
| 61-147577 | 7/1986 | Japan .......................... | 357/22 MD |

OTHER PUBLICATIONS

H. Ohno et al., "Double Heterostructure Gn 0.47 In 0.53 Aa MESFETs by MBE*," IEEE Elec. Dev. Lett., vol. EDL-1, #8, Aug. 1980, pp. 154-155.

Primary Examiner—Joseph E. Clawson, Jr.
Attorney, Agent, or Firm—Antonelli, Terry & Wands

[57] ABSTRACT

Disclosed is a semiconductor device comprising a first semiconductor layer, a second semiconductor layer, and a third semiconductor layer which is formed between the first semiconductor layer and the second semiconductor layer and a band gap of which is narrower than that of each of the first and second layers, so that band discontinuities in conduction bands and valence bands of the three layers form a barrier to the third semiconductor layer, and that a tunneling current can flow through the third semiconductor layer owing to an internal electric field of the third semiconductor layer.

26 Claims, 5 Drawing Sheets

SUBSTRATE | p+LAYER | UNDOPED WELL LAYER | n+CAP LAYER | GATE 4,835,581

ELECTRON GAS HOLE GAS TUNNELING TRANSISTOR DEVICE

BACKGROUND OF THE INVENTION

I. FIELD OF THE INVENTION

The present invention relates to an ultrahigh speed transistor which utilizes tunneling. More particularly, it relates to a three-terminal tunnel FET in which a tunneling current is induced by applying an external gate field to a semiconductor layer held in a double heterojunction.

II. DESCRIPTION OF THE RELATED ART

As a device exhibiting a switching time on the order of picoseconds at room temperatures, there has heretofore been an Esaki diode constructed of a p+/n+ junction as shown in FIG. 6(a). As is well known, this diode is based on the fact that, since the depletion layer of the heavily doped $p^{30}/n^+$ junction becomes as thin as about 100 Å, an electron tunneling current flows between the conduction band of the n+-layer and the valence band of the p+-layer (refer to S. M. Sze: "Physics of Semiconductor Devices," John Wiley & Sons, Inc., N.Y. (1981), p. 513).

Since, however, the Esaki diode is a two-terminal device, it has limits to applications as practical logic switching devices and is not used nowadays. It is therefore desired to develop a three-terminal device of the FET type in which the electrical isolation between an input and an output is favorable, while the high speed of the tunneling is exploited.

FIG. 6(c) is a conceptual diagram of the current-voltage characteristic of the tunnel diode, in which $V_p$ and $I_p$ denote the values of a voltage and a current that produce the peak current with a forward bias, and $V_v$ and $I_v$ denote the values of a voltage and a current that produce a valley current, respectively. The figure of merit of the tunnel diode in the application to microwaves etc. is expressed by $I_p/C_j$ where $C_j$ indicates a junction capacitance. Decrease in $C_j$ necessitates making the area of the junction as small as several $\mu m^2$ or below Assuming $I_p \geq 5$ mA, however, a certain degree of junction area is required in order to avoid an excessively high current density.

SUMMARY OF THE INVENTION

An object of the present invention is to provide an improved semiconductor device.

Another object of the present invention is to provide a semiconductor device which operates at high speed.

Still another object of the present invention is to provide a semiconductor device which is hardly affected by thermal noise.

In order to accomplish the aforementioned and other objects, the present invention adopts the construction of a semiconductor device comprising a first semiconductor layer, a second semiconductor layer, and a third semiconductor layer which is interposed between the first semiconductor layer and the second semiconductor layer and a band gap of which is narrower than that of each of the first and second layers, so that band discontinuities among conduction bands and valence bands of the three layers form barriers to the third semiconductor layer, and that a tunneling current can flow between a boundary of the first and third semiconductor layers and a boundary of the second and third semiconductor layers owing to an internal electric field within the third semiconductor layer.

BRIEF DESCRIPTION OF THE DRAWINGS

FIG. 1(a) is a structural diagram of a tunnel FET according to the present invention, while

DETAILED DESCRIPTION OF THE PREFERRED EMBODIMENTS

Figure 1A:
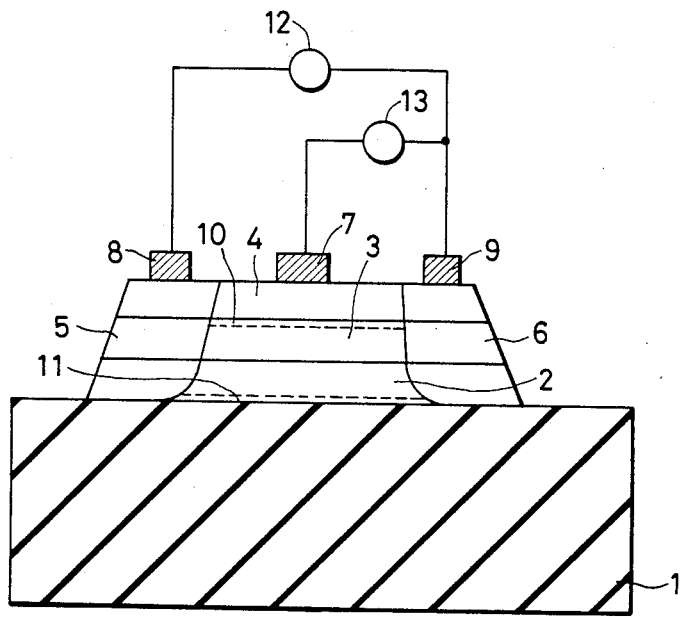

A semiconductor device according to the present invention will be described in detail in conjunction with an embodiment. FIG. 1(a) shows the structure of an FET which exploits the tunnel effect.

This transistor basically has such a structure that, on a semi-insulating substrate crystal 1, a very thin layer having a $p^{30}/n^+$ homo-junction (2, 3) which has a band gap smaller than that of the substrate and whose whole thickness is equal to the width of a depletion layer or so is formed, and that it is held in a double heterojunction defined by the substrate crystal 1 and a cap layer 4 which has a band gap greater than that of this layer having the p+/n+ junction (2, 3). The p+-layer 2 and n+-layer 3 are respectively formed with contact regions 6 and 5 by diffusion, ion implantation or the like, and a drain electrode 9 and a source electrode 8 are formed on the respective contact regions. In addition, a gate electrode 7 is formed on the cap layer 4.

Numerals 12 and 13 in the figure indicate a source-drain bias ($V_{sd}$) and a gate bias ($V_g$), respectively.

Figure 1B:
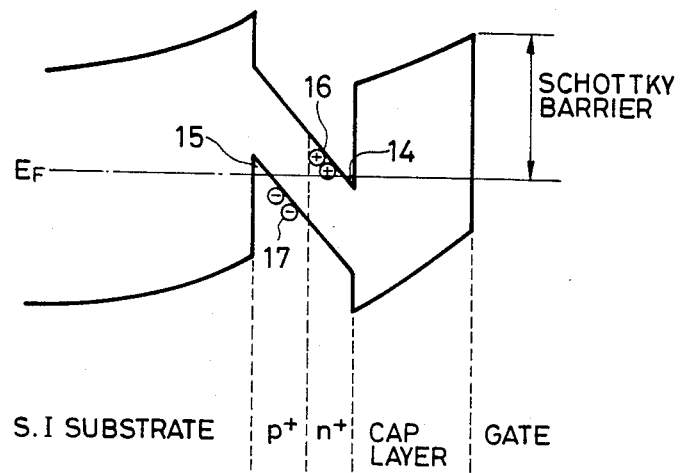
FIG. 1(b) is an energy band diagram thereof.
Figure 2A:
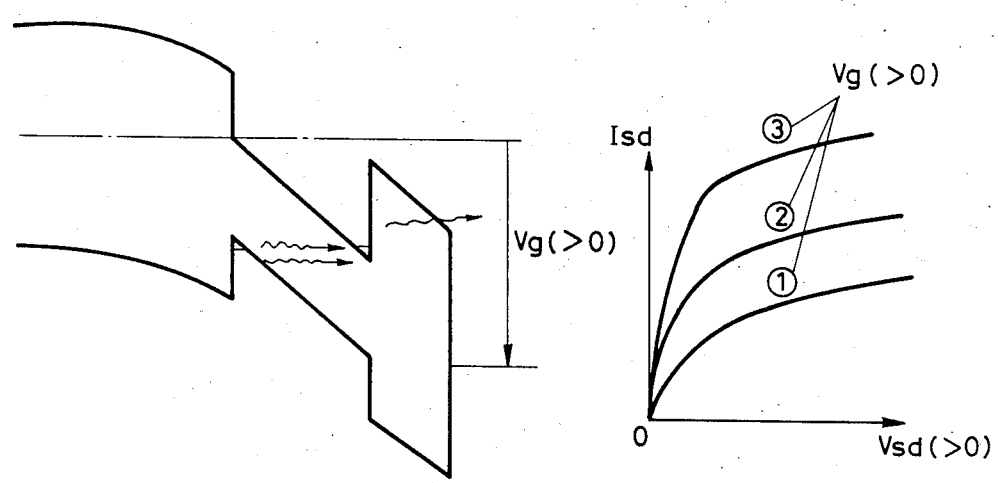
FIGS. 2(a) and 2(b) are current-voltage characteristic diagrams and band diagrams of tunnel FETs according to the present invention.
Figure 2B:
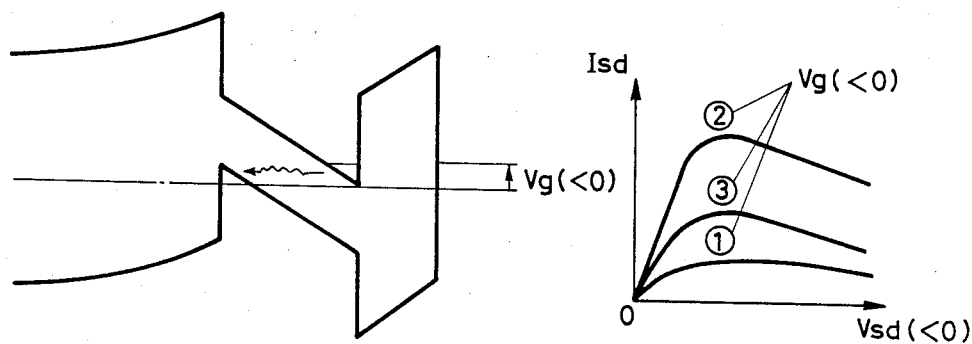

The band structure of that part of the structure of FIG. 1(a) which underlies the gate electrode 7 is shown in FIG. 1(b) with respect to the thermal equilibrium at a gate voltage=0. A two-dimensional electron gas layer 10 or 14 and a two-dimensional hole gas layer 11 or 15 are induced at the heterojunction boundaries of the double heterojunction structure, and the charges of these layers balance with the total quantities of the charges of ionized donors 16 and ionized acceptors 17 within the depletion layer of the p+/n+ junction, whereby an electrical neutral condition is held. The two-dimensional electron gas 10 or 14 and the two-dimensional hole gas 11 or 15 join with the source electrode 8 in FIG. 1 (a) and similarly with the drain electrode 9 under very low series resistances, respectively. In contrast, the potential barrier of the depletion layer intervenes between the two-dimensional electrons and the two-dimensional holes, and the source-drain current of the FET is very low at the gate voltage=0. Under this state, the source-drain bias $V_{sd}$ and the gate bias $V_g$ are respectively applied to the source electrode 8 and the gate electrode 7 with reference to the drain electrode 9 as illustrated in FIG. 1(a). Several combinations of the signs of the bias voltages $V_{sd}$ and $V_g$ afford different current-voltage characteristics, and simple combinations consist of the voltages $V_{sd}$ and $V_g$ of identical signs. FIG. 2(a) illustrates a situation in which a reverse tunneling current flows under a reverse bias, while FIG. 2(b) illustrates a situation in which a forward tunneling current flows. With the reverse bias, when the gate voltage is enlarged, the current increases monotonically, but with a forward bias, when the gate voltage is enlarged, decrease in the tunneling current occurs on the basis of the same principle as in the Esaki diode. Such currents $I_{sd}$ do not depend very intensely upon the source-drain voltages $V_{sd}$. Anyway, the speed at which the tunneling arises is on the order of picoseconds, so that a switching time of about 100 picoseconds can be achieved by optimizing the capacity and current value of the device.

Meanwhile, in the construction of FIG. 1(a), leakage currents can develop through the p-n junctions between the n+-layer 3 and p+-contact layer 6 and between the p+-layer 2 and the n+-contact layer 5. The influences of the leakage currents, however, are negligibly small.

In the case of Ge, with a doping concentration of about $1 \times 10^{19}$ cm$^{-3}$ for the p+- and n+-layers, the width of the depletion layer is approximately 100 Å, and the internal electric field is approximately $1 \times 10^6$ V/cm. Accordingly, the sum of the thicknesses of the p+-layer and the n+-layer may be 100 Å–150 Å.

In addition, the peak current density $J_p$ corresponding to the peak current $I_p$ of the tunnel diode stated before is approximately $10^2$ A/cm$^2$.

Figure 7:
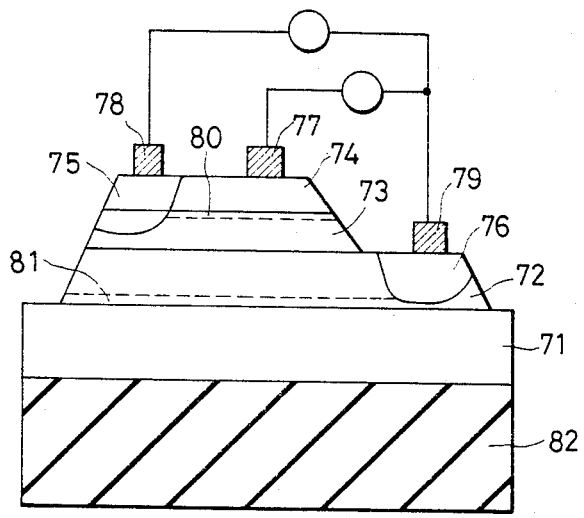
FIG. 7 is a structural diagram of a tunnel FET in an embodiment of the present invention.

FIG. 7 shows another embodiment of the present invention. This embodiment is an improvement on the embodiment of FIG. 1(a). Although the leakage current between the source and drain is negligible in the embodiment of FIG. 1(a), it is further reduced so as to enhance the characteristics in the present embodiment.

It is as in the foregoing embodiment of FIG. 1(a) that a buffer layer 71 is formed on a substrate crystal 82, and that a layer having a p+/n+ homo-junction (72, 73) which has a band gap smaller than that of the buffer layer 71 and which has a whole thickness nearly equal to the width of a depletion layer is so formed as to be held in a double heterojunction defined by the buffer layer 71 and a cap layer 74 which has a band gap greater than that of the layer having the p+/n+ junction (72, 73). Regarding contact regions to be formed by diffusion, ion implantation or the like, an ion-implanted layer (n++) 75 is formed on the side of a source electrode 78 by, for example, the ion implantation of Si so shallowly that the n+/p+ boundary is not reached, while the cap layer 74 and the n+-layer 73 on the side of a drain electrode 79 are etched and removed down to the n+/p+ boundary by dry etching, and a p++-layer 76 is formed in the corresponding part of the p+-layer 72 by the diffusion of Zn or the ion implantation of Be.

Thereafter, ohmic electrodes are respectively formed on the n++-layer 75, p++-layer 76 and cap layer 74 as the source electrode 78, the drain electrode 79 and a gate electrode 77 by evaporation.

According to the present embodiment, the leakage current elucidated in FIGS. 1(a) and 1(b) is almost nonexistent, and hence, a semiconductor device of still better characteristics can be realized.

In the embodiment of FIG. 7, the first semiconductor layer defined in the present invention is the buffer layer 71 formed on the crystal substrate 82. Such a construction may of course be employed.

By way of example, in case of using a GaAs substrate, it is possible to use $Ga_{1-x}Al_xAs$ for the buffer layer, a GaAs-based material for the third semiconductor layer, and $Ga_{1-u}Al_uAs$ (u~0.3) for the second semiconductor layer. Likewise, in case of using an InP substrate, it is possible to use InP, InAlAs or InGaAsP for the buffer layer, InGaAs or InGaAsP for the third semiconductor layer, and InAlAs, InGaAsP or InGaAlAs for the second semiconductor layer.

Besides, a semi-insulating material is suitable as the substrate 82.

Figure 3:
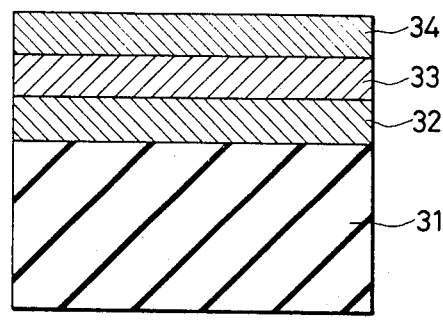
FIG. 3 is a diagram showing the crystal structure of an embodiment of the present invention.

FIG. 3 shows another example of a crystal structure which the semiconductor device can have according to the present invention. A substrate 31 was semi-insulating GaAs, on which a p+/n+ junction layer made up of p+-Ge (p≃$1 \times 10^{18}$–$10^{19}$ cm$^{-3}$, thickness ≃100 Å) 32 and n+-Ge (n≃$1 \times 10^{18}$–$10^{19}$ cm$^{-3}$, thickness ≃100 Å) 33, and a hetero-cap layer 34 (undoped GaAs or $Al_xGa_{1-x}As$ (x~0.5–0.7), thickness: 500–2000 Å) were grown by molecular-beam epitaxy (MBE) or metal-organic chemical vapor deposition (MOCVD).

Figure 4:
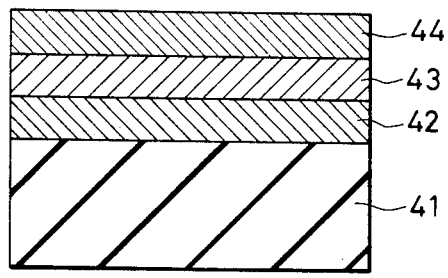
FIG. 4 is a diagram showing the crystal structure of another embodiment of the present invention.

FIG. 4 shows still another example. A substrate 41 was semi-insulating InP, a layer 42 was made of p+-$In_{0.53}Ga_{0.47}As$, a layer 43 was made of n+-$In_{0.53}Ga_{0.47}As$ (the total thickness of the layers 42 and 43 was approximately 100 Å), and a hetero-cap layer 44 was made of undoped InP or $In_{0.52}Al_{0.48}As$ (500–2000 Å thick). A contact for the n+-layer was formed in such a way that a contact layer having an impurity concentration of or above $2 \times 10^{18}$ cm$^{-3}$ was formed by a method of ion-implanting and then annealing Si, whereupon AnGe, Ni and An were evaporated and then alloyed as an ohmic electrode. The alloy layer was so deep as to penetrate the cap layer and to extend down to a level within the n+-layer. On the other hand, a contact for the p+-layer was formed in such a way that a contact layer was formed by diffusing Zn or ion-implating Be deep enough to reach the p+-layer, whereupon Cr—Au was or Ti, Pt and An were evaporated as an ohmic electrode. The parts of the layers other than device portions were mesa-etched and removed down to the substrate. Al/Ti, or the like was used as a gate metal.

FETs as shown in FIG. 1(a) were manufactured for trial by the use of these crystal structures illustrated in FIGS. 3 and 4. When the current-voltage characteristics of the FETs under forward and reverse biases were measured, characteristics as illustrated in FIGS. 2(a) and 2(b) were obtained. In addition, switching times responsive to gate voltage pulses became several picoseconds, and the possibility of an ultrahigh speed switching device could be verified. It has been revealed that, as the heterojunction cap layer under the gate electrode exhibits a greater conduction-band-discontinuity $\Delta E_c$ with respect to the p/n junction portion, the gate leakage current becomes less advantageously. Besides, similar characteristics were obtained as to crystal structures in which the p+- and n+-layers 32 and 33 in FIG. 3 and 42 and 43 in FIG. 4 were replaced with each other.

Figure 5A:
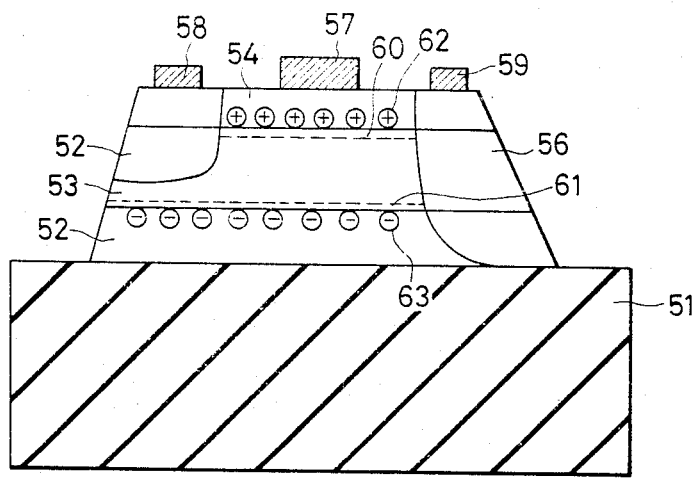
FIGS. 5(a) and 5(b) are structural diagrams of a tunnel FET in still another embodiment of the present invention.

Further, as another embodiment, there was fabricated a structure shown in FIG. 5(a) in which the barrier layer of a heterojunction was doped as in a HEMT to thereby form a two-dimensional electron layer 60 and a two-dimensional hole layer 61 on both the sides of an undoped layer 53. The tunneling between the layers 60 and 61 was controlled by a gate electrode 57. Since, in this case, the layer 53 was of high resistivity, the isolation between a source and a drain under the null gate voltage was improved. However, ohmic contacts for the two-dimensional electron and hole layers were more difficult than in the case of FIG. 1(a), and the parasitic resistance of an FET became high. On a semi-insulating InP substrate 51, there were grown a p+-In$_{0.52}$Al$_{0.48}$As layer 52 ($1 \times 10^{18}$–$10^{19}$ cm$^{-3}$, 500–100 Å thick), the undoped In$_{0.53}$Ga$_{0.47}$As layer 53 (about 200 Å thick), and an n+-In$_{0.52}$Al$_{0.48}$As layer 54 ($1 \times 10^{18}$–$10^{19}$ cm$^{-3}$, 500–2000 Å thick). With this crystal structure, characteristics similar to those of the structures in FIGS. 3 and 4 were obtained.

Figure 5B:
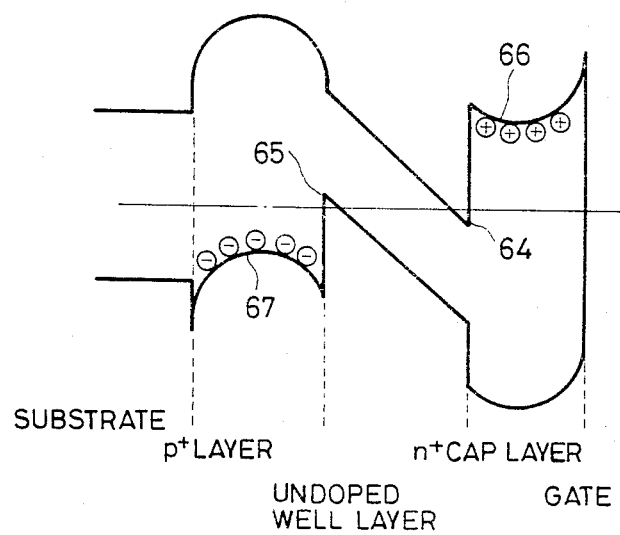
Figures 6A, 6B, 6C:
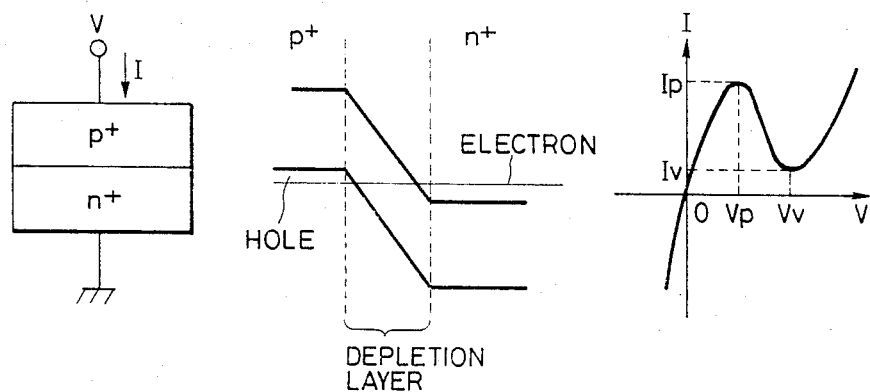
FIGS. 6(a)–6(c) are structural and characteristic diagrams of a conventional tunnel diode.

In FIG. 5(a), numerals 55 and 56 designate n-type and p-type contact layers, numerals 58 and 59 source and drain electrodes, and numerals 62 and 63 ionized doners and acceptors, respectively. In FIG. 5(b), numeral 64 indicates the two-dimensional electron gas layer, numeral 65 the two-dimensional hole gas layer, numeral 66 the ionized donors, and numeral 67 the ionized acceptors.

In the above, the hetero-cap layer epitaxially grown on the p+/n+ junction layer was used. FETs in each of which the hetero-cap layer was replaced with an insulator gate such as of SiO$_2$ or SiN$_x$ were fabricated for trial, and similar high-speed switching characteristics were attained. Among these tunnel FETs, the FET in FIG. 1(a) had a very low series resistance, so that the thermal noise was of low level, and characteristics favorable for a high-frequency and low-noise transistor could be achieved.

What is claimed is:

1. A semiconductor device comprising:
   a first semiconductor layer;
   a second semiconductor layer;
   a third semiconductor layer being formed between the first and second semiconductor layers, having first carriers at a first boundary of the first and the third semiconductor layers and second carriers at a second boundary of the second and the third semiconductor layers, and having a band gap narrower than those of the first and the second semiconductor layers so that band discontinuities in conduction bands and valence bands of the three layers form barriers to the first and second carriers;
   a first electrode being disposed so as to be electrically connected to the first boundary and substantially without being connected to the second boundary;
   a second electrode being disposed so as to be electrically connected to the second boundary and substantially without being connected to the first boundary; and
   a third electrode for applying an electrical field to the third semiconductor layer so as to effect in controlling flow of a tunneling current of the first and the second carriers between the first and the second boundaries in accordance with the electric field in the third semiconductor layer.

2. A semiconductor device as claimed in claim 1, wherein said first semiconductor layer is made of a semiconductor material principally composed of GaAs, said second semiconductor layer is made of a semiconductor material principally composed of Al$_x$Ga$_{1-x}$As, and said third semiconductor layer is made of a semiconductor material principally composed of Ge.

3. A semiconductor deice as claimed in claim 1, wherein said first semiconductor layer is made of a semiconductor material principally composed of InP, said second semiconductor layer is made of a semiconductor material principally composed of In$_{0.52}$Al$_{0.48}$As, and said third semiconductor layer is made of a semiconductor material principally composed of In$_{0.53}$Ga$_{0.47}$As.

4. A semiconductor device according to claim 1, wherein the first and the second carriers are two dimensional hole and electron gas layers, respectively.

5. A semiconductor device according to claim 4, wherein the third semiconductor layer has a p+ doped region and an n+ doped region so as to form a p+/n+ junction therein.

6. A semiconductor device according to claim 4, wherein the third semiconductor layer is undoped, and the first and the second semiconductor layers are p+ and n+ doped layers, respectively.

7. A semiconductor device according to claim 6, wherein the first semiconductor layer is formed on a substrate.

8. A semiconductor device according to claim 5, wherein the first semiconductor layer includes a buffer layer formed on a substrate.

9. A semiconductor device according to claim 1, wherein the first semiconductor layer is a substrate.

10. A semiconductor device according to claim 9, wherein said first semiconductor layer is made of a semiconductor material principally composed of GaAs, said second semiconductor layer is made of a semiconductor material principally composed of Al$_x$Ga$_{1-x}$As, and said third semiconductor layer is made of a semiconductor material principally composed of Ge.

11. A semiconductor device according to claim 9, wherein said first semiconductor layer is made of a semiconductor material principally composed of InP, said second semiconductor layer is made of a semiconductor material principally composed of In$_{0.52}$Al$_{0.48}$As, and said third semiconductor layer is made of a semiconductor material principally composed of In$_{0.53}$Ga$_{0.47}$As.

12. A semiconductor device according to claim 1, wherein said first, second and third electrodes comprise drain, source and gate electrodes of a high-frequency, low-noise field-effect transistor device.

13. A high-frequency and low-noise semiconductor transistor device comprising:
   first, second and third semiconductor layers vertically disposed in an arrangement wherein said third semiconductor layer is formed on said first semiconductor layer and said second semiconductor layer is formed on said third semiconductor layer, said third semiconductor layer having first carriers at a first heterojunction formed by said first and third semiconductor layers and second carriers at a second heterojunction formed by said second and third semiconductor layers and having a band gap narrower than those of said first and second semiconductor layers so that band discontinuities in conduction bands and valence bands of the three layers form barriers to said first and second carriers;
   a first electrode having a contact region disposed in a portion of said third semiconductor layer and extending to a main surface of said device so as to be electrically connected to said first heterojunction and substantially without being connected to said second heterojunction;
   a second electrode having a contact region disposed in a portion of said third semiconductor layer and extending to the main surface of said device so as to be substantially electrically connected to said second heterojunction and substantially without being connected to said first heterojunction; and a third control electrode including said second semiconductor layer as a contact region for applying an electric field to said third semiconductor layer so as to effect in controlling flow of induced tunneling current of said first and second carriers between said first and second heterojunctions in accordance with the electric field in said third semiconductor layer.

14. A semiconductor transistor device according to claim 13, wherein said first and second carriers are two-dimensional hole and electron gas layers, respectively.

15. A semiconductor transistor device according to claim 14, wherein said third semiconductor layer has a p+ doped region and an n+ doped region so as to form a p+/n+ junction therein.

16. A semiconductor transistor device according to claim 14, wherein said third semiconductor layer is undoped, and said first and second semiconductor layers are p+ and n+ doped layers, respectively.

17. A semiconductor transistor device according to claim 16, wherein said first semiconductor layer is formed on a substrate.

18. A semiconductor transistor device according to claim 15, wherein said first semiconductor layer includes a buffer layer formed on a substrate.

19. A semiconductor transistor device according to claim 13, wherein said first semiconductor layer is a substrate.

20. A semiconductor transistor device according to claim 16, wherein said first semiconductor layer is made of a semiconductor material principally composed of GaAs, said second semiconductor layer is made of a semiconductor material principally composed of $Al_x$-$Ga_{1-x}As$, and said third semiconductor layer is made of a semiconductor material principally composed of Ge.

21. A semiconductor transistor device according to claim 19, wherein said first semiconductor layer is made of a semiconductor material principally composed of InP, said second semiconductor layer is made of a semiconductor material principally composed of $In_{0.52}Al_{0.48}As$, and said third semiconductor layer is made of a semiconductor material principally composed of $In_{0.53}Ga_{0.47}As$.

22. A semiconductor transistor device according to claim 19, wherein said first electrode contact region comprises one of a diffused Zn doped layer and an ion-implanted layer of Be, and wherein said second electrode contact region comprises an ion-implanted layer of Si.

23. A semiconductor transistor device according to claim 18, wherein said first electrode contact region comprises one of a diffused Zn doped layer and an ion-implanted layer of Be, and wherein said second electrode contact region comprises an ion-implanted layer of Si.

24. A semiconductor transistor device according to claim 20, wherein said first electrode contact region comprises one of a diffused Zn doped layer and an ion-implanted layer of Be, and wherein said second electrode contact region comprises an ion-implanted layer of Si.

25. A semiconductor transistor device according to claim 21, wherein said first electrode contact region comprises one of a diffused Zn doped layer and an ion-implanted layer of Be, and wherein said second electrode contact region comprises an ion-implanted layer of Si.

26. A semiconductor transistor device according to claim 13, wherein said first, second and third electrodes comprise drain, source and gate electrodes of a field-effect transistor device.

* * * * *